United States Patent
Guerrero Mercado (10) Patent No.: US 6,525,573 B1
(45) Date of Patent: Feb. 25, 2003

(54) SIGNAL PROCESSING ARCHITECTURE (75) Inventor: Francisco Javier Guerrero Mercado, Landsberg am Lech (DE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/039,762

(22) Filed: Oct. 26, 2001

(51) Int. Cl.$^7$ ............................................... H03K 5/153
(52) U.S. Cl. ........................................... 327/72; 327/73
(58) Field of Search ........................... 327/72, 73, 363, 327/77, 88, 89, 87, 560–563

(56) References Cited

U.S. PATENT DOCUMENTS

| | | | | |
|---|---|---|---|---|
| 4,588,905 A | * | 5/1986 | Kojima | 327/72 |
| 4,821,292 A | * | 4/1989 | Childress | 327/73 |
| 5,015,878 A | * | 5/1991 | Lasagna et al. | 327/72 |
| 5,274,273 A | * | 12/1993 | Baginski et al. | 327/72 |
| 5,438,289 A | * | 8/1995 | Kan et al. | 327/73 |
| 5,804,997 A | * | 9/1998 | Nishizono et al. | 327/73 |

OTHER PUBLICATIONS

"Introduction to Data Conversion and Processing", Data Conversion System Design by Behzad Ravavi, IEEE Press ISBN 0–7803–1093–4, pp. 1–5.
Page 9 of NSC 'Application Note 4' from 1991 NSC Linear Applications Handbook.

* cited by examiner

Primary Examiner—Toan Tran
(74) Attorney, Agent, or Firm—Merchant & Gould PC; Timothy P. Sullivan (57) ABSTRACT The present invention implements a signal processing function without the use of a DSP (digital signal processor) or ADC. A reference signal is produced that relates to a DAC output code. The reference signal is used as a starting point, and is compared to the input signal. A feedback signal is produced that is used to adjust the reference. The invention can be used to implement signal processing functions such as peak detection, noise filtering, peak suppression, and the like. The invention can implement these functions with a minimal complexity and a minimal die area.

15 Claims, 6 Drawing Sheets

SIGNAL PROCESSING ARCHITECTURE

FIELD OF HE INVENTION

The present invention is related to signal processing, and more specifically to signal processing without the use of a digital signal processor and A/D converter.

BACKGROUND OF THE INVENTION

Generally, signal processing involves the use of a digital signal processor to perform the desired signal processing function. Typically, the following method is used in performing a signal processing function. First, an analog signal is filtered with an anti-alias filter. The analog signal is then converted to a digital signal by means of an ADC (analog to digital converter). Next, a DSP (digital signal processor) is used perform the desired signal processing function on the digital signal. The digital signal is then converted back to an analog signal by means of a DAC (digital to analog converter). Finally, the signal is filtered with a low pass filter.

The signal processing system described above requires many complex components taking up resources on the circuit. For example, extra power supplies may be needed to provide power to the DSP (digital signal processor), ADC, or other components. Additionally, the available die area on the chip is reduced by each extra component placed on it. For example, the DSP takes up valuable resources on the circuit. Even simple signal processing functions may require many extra components taking up valuable resources.

SUMMARY OF THE INVENTION

The present invention is directed at performing signal processing function without the use of a digital signal processor and ADC. The signal processing architecture described herein may be used to perform many different signal processing functions. For example, the invention is directed at performing signal processing functions, including validating a code or signal if stable for a predetermined number of clock cycles, peak detection, peak suppression, and the like. The invention is also directed at implementing such functions with minimal complexity and a minimal die area.

According to one aspect of the invention, no A/D converter circuitry is needed. Instead, a reference signal, which according to one embodiment of the invention relates to a DAC output signal, is used as a starting point and is adjusted to produce the desired signal processing function. Comparisons are made between the reference signal and an input signal. The reference signal is adjusted to obtain the desired signal processing function. The reference signal is then converted by a DAC (digital to analog conversion) circuit to obtain an address depending on the signal processing function applied to the incoming signal.

According to another aspect of the invention, an algorithm implements a signal processing function based on the history of the last n comparisons between the reference signal and the incoming signal, where n is a predetermined number greater than zero. The algorithm may also generate feedback that modifies the reference signal.

According to another aspect of the invention, an apparatus for signal processing comprises a controlled reference circuit that produces a reference signal corresponding to a code. The apparatus also comprises a decision level processing circuit that is arranged to make a comparison between the reference signal and an input signal. The decision level processing circuit is configured to produce a desired signal processing function in response to the comparison.

According to another aspect of the invention, a method for signal processing using the novel signal processing architecture is provided. The method includes making a comparison between a reference code relating to a code and another signal, applying a signal processing function to the signal, and producing an output signal in response to the comparison and the signal processing function.

According to yet another aspect of the invention, an apparatus for a signal processing architecture comprises a means for signal processing without the use of a DSP and ADC. The apparatus produces a reference signal in response to a DAC signal and makes a comparison between the reference signal and an analog signal. A means for signal processing is applied and a signal is produced in response to the comparison and the signal processing function.

DETAILED DESCRIPTION OF THE PREFERRED EMBODIMENTS

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means a direct electrical connection between the items connected, or an indirect connection through one or more passive or active intermediary devices. The term "circuit" means either a single component or a multiplicity of components, either active and/or passive, that are coupled to provide a desired function. The term "signal" means at least one current, voltage, or data signal.

Briefly described, the present invention is directed at signal processing without the use of a digital signal processor and ADC. A reference signal is used as a starting point and is adjusted to obtain the desired signal processing function. According to one embodiment of the invention, comparisons are made between a reference signal, relating to the output code of a DAC (digital to analog conversion) circuit, and the input signal thereby generating a comparison result signal. Logic is then applied to the comparison result signal to implement a desired signal processing function. The logic is also used to help generate a feedback signal that may modify the reference signal. The novel signal processing architecture may be used to implement many different signal-processing functions. For example, functions such as peak detection, noise filtering, and peak suppression may be performed by the architecture.

Figure 1:
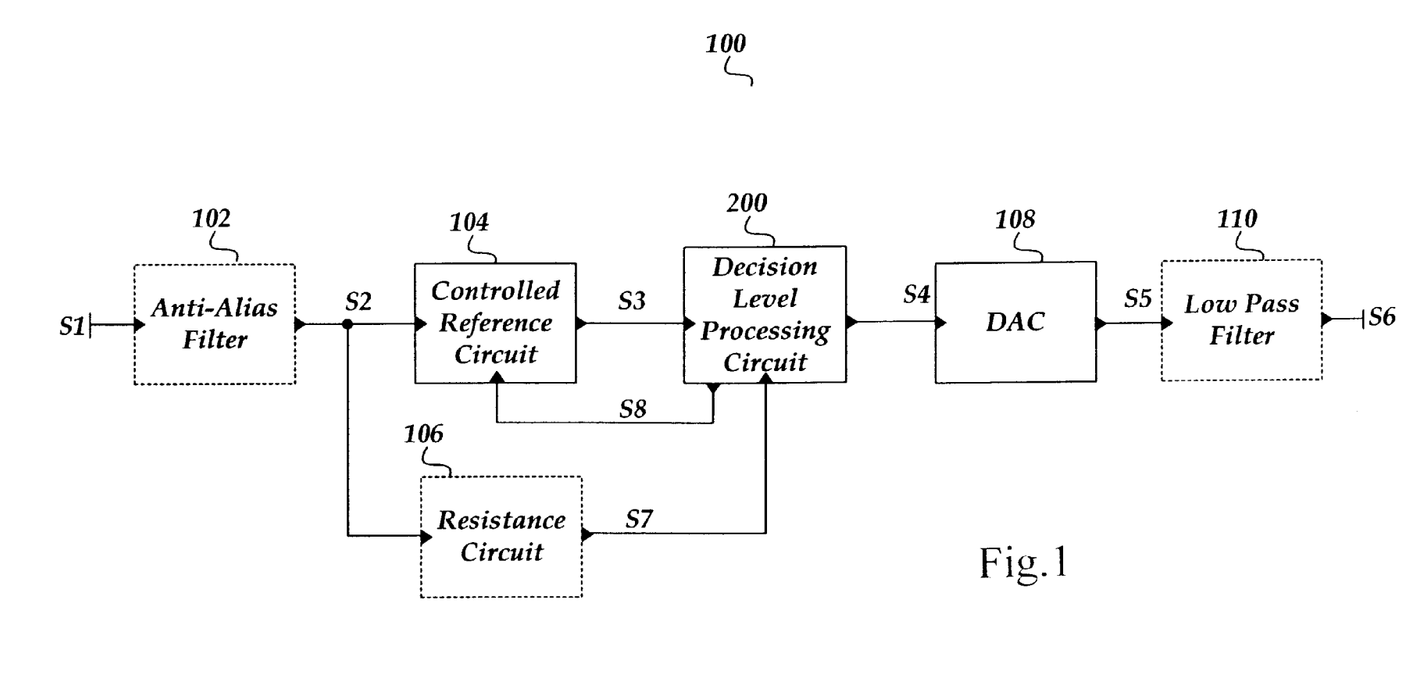
FIG. 1 shows a schematic block diagram of a signal processing architecture.

FIG. 1 is a schematic block diagram of a signal processing architecture, in accordance with aspects of the invention. As shown in the figure, signal processing architecture 100 includes anti-alias filter 102, controlled reference circuit 104, resistance circuit 106, decision level processing circuit 200, DAC circuit 108, and low pass filter 110.

Signal processing architecture 100 is connected as follows. Anti-alias filter 102 includes an input coupled to signal S1, an output coupled that is coupled to an input of controlled reference circuit 104, and an output that is coupled to resistance circuit 106. Controlled reference circuit 104 has an input that is coupled to anti-alias filter 102, an input that is coupled to decision level processing circuit 200, and an output that is coupled to decision level processing circuit 200. Resistance circuit 106 has an input that is coupled to anti-alias filter 102, and an output that is coupled to decision level processing circuit 200. Decision level processing circuit 200 has an input that is coupled to controlled reference circuit 104, an input that is coupled to resistance circuit 106, an output that is coupled to DAC 108, and another output that is coupled to a controlled reference circuit 104. DAC 108 has an input that is coupled to decision level processing circuit 200, and an output that is coupled to low pass filter 110. Low pass filter 110 has an input that is coupled to DAC 108 and an output that is coupled to signal S6.

Signal processing architecture 100 operates as follows. Input signal S1 is filtered by anti-alias filter 102 producing signal S2. Controlled reference circuit 104 produces reference signal S3 that relates to signal S2. According to one embodiment of the invention, controlled reference circuit 104 is a DAC. According to an embodiment, controlled reference circuit 104 produces a reference voltage signal that corresponds to a given input signal (S2). Signal S3 may also be adjusted in response to decision level processing circuit 200. By directly adjusting the controlled reference circuit output reference signal S3, a desired signal processing function may be applied to input signal S1 without the use of a DSP and ADC.

Resistance circuit 106 produces signal S7 in response to incoming signal S2. Signal S7 directly relates to input signal S2. Decision level processing circuit 200 compares signal S3, output from controlled reference circuit 104, and signal S7, output by resistance circuit 106. According to one embodiment, decision level processing circuit 200 determines if the reference signal is larger/smaller than the input signal. In response to the comparison between signal S3 output from controlled reference circuit 104 and the input signal S7, decision level processing circuit 200 produces signal S4 that relates to the decision. As discussed above, decision level processing circuit 200 produces signal S8 that may be used to adjust signal S3 produced by controlled reference circuit 104. Decision level processing circuit 200 contains the logic necessary to perform the desired signal processing function. For example, decision level processing circuit may contain the logic to perform signal processing functions such as peak detection, final DC value, peak suppression, and the like. Decision level processing circuit 200 includes the components to perform the desired logic. For example, decision level processing circuit 200 may contain a comparator and a register that determines when the input signal S1 is stable for a predetermined number of cycles. Decision level processing circuit 200 may also contain counters and other components to produce the desired signal processing function. For example, signal S3 may only be adjusted if the signal is above or below a value for a predetermined number of times. Digital signal S4 is converted into analog signal S5 by DAC 108. Low pass filter 110 filters signal S5 to produce signal S6. Anti-alias filter 102, resistance circuit 106, and low-pass filter 110 are optional, and can be removed.

Signal processing architecture 100 has several advantages. The architecture has a very low cost of manufacture, and utilizes a low die area. Additionally, the architecture does not require the use of a digital signal processor to perform signal processing functions.

Figure 2:
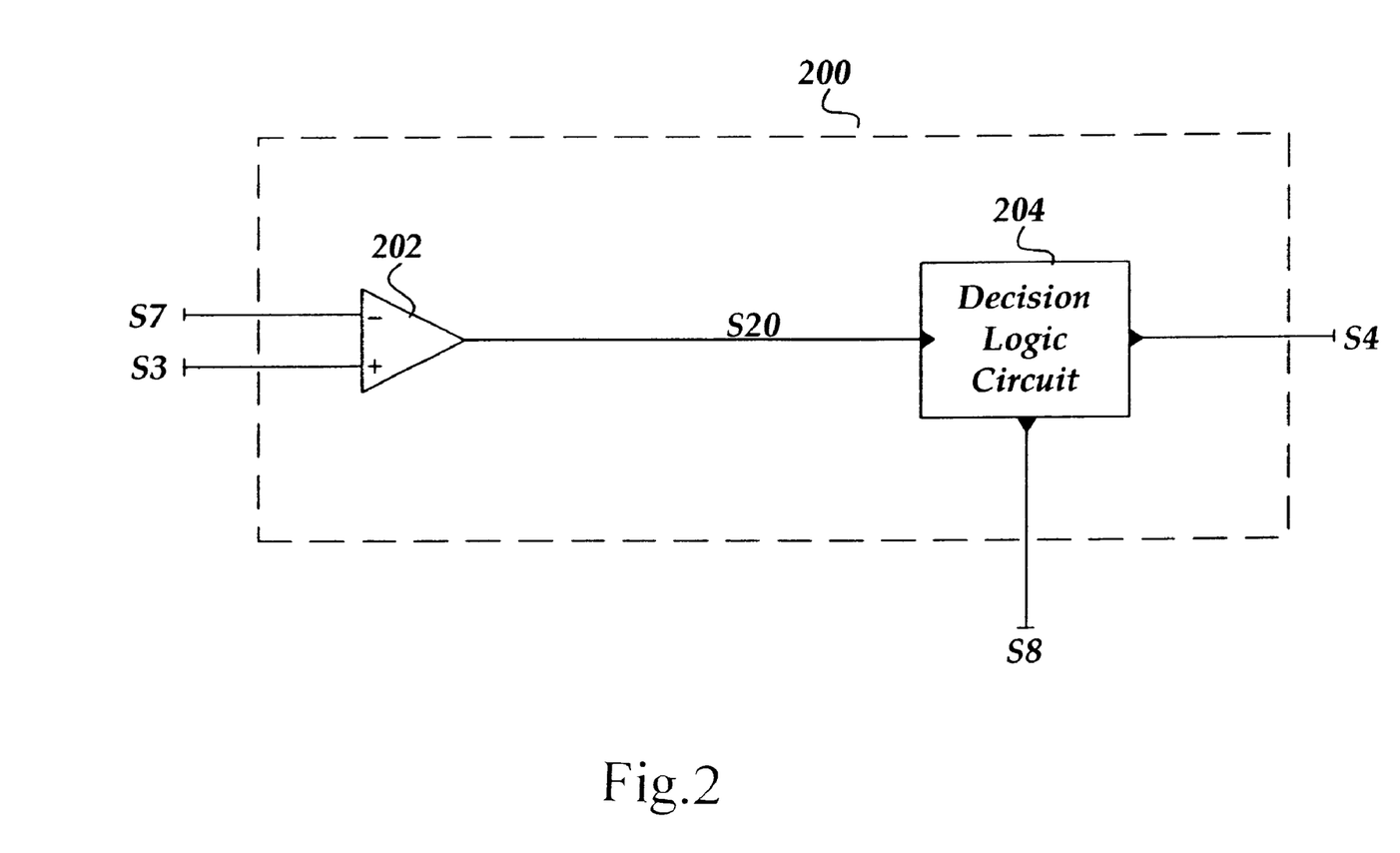
FIG. 2 illustrates a schematic block diagram of an exemplary decision level processing circuit.

FIG. 2 illustrates a schematic block diagram of an exemplary decision level processing circuit, according to one embodiment of the invention. As shown in the figure, decision level processing circuit 200 includes comparator 202 and decision logic circuit 204.

Comparator 202 has an inverting input (−) coupled to signal S7, a non-inverting input (+) coupled to signal S3, and an output coupled to decision logic circuit 204. Decision logic circuit 204 has an input coupled to the output of comparator 202, an output coupled to signal S8, and an output coupled to signal S4. Decision level processing circuit 200 operates as follows. Comparator 202 compares signal S7 with signal S3. In response to the comparison, comparator 202 produces comparison result signal S20. According to one embodiment of the invention, comparator 202 is a sampling comparator. Decision logic circuit 204 is configured to perform an algorithm to produce signal S4. The algorithm used by decision logic circuit 204 depends on the signal processing function that is being implemented. Many different algorithms may be used to implement any particular signal processing function. According to one embodiment of the invention, decision logic circuit 204 implements a fast attack/slow decay peak detection signal processing algorithm (See FIG. 3 and related discussion). Other algorithms may be implemented. The outputs of decision logic circuit 204 depends on at least one sample of comparison result signal S20. In response to the signal processing algorithm, decision logic circuit 204 outputs signal S8 that may be used to adjust the controlled reference circuit thereby performing the desired signal processing function on the incoming signal.

Figure 3:
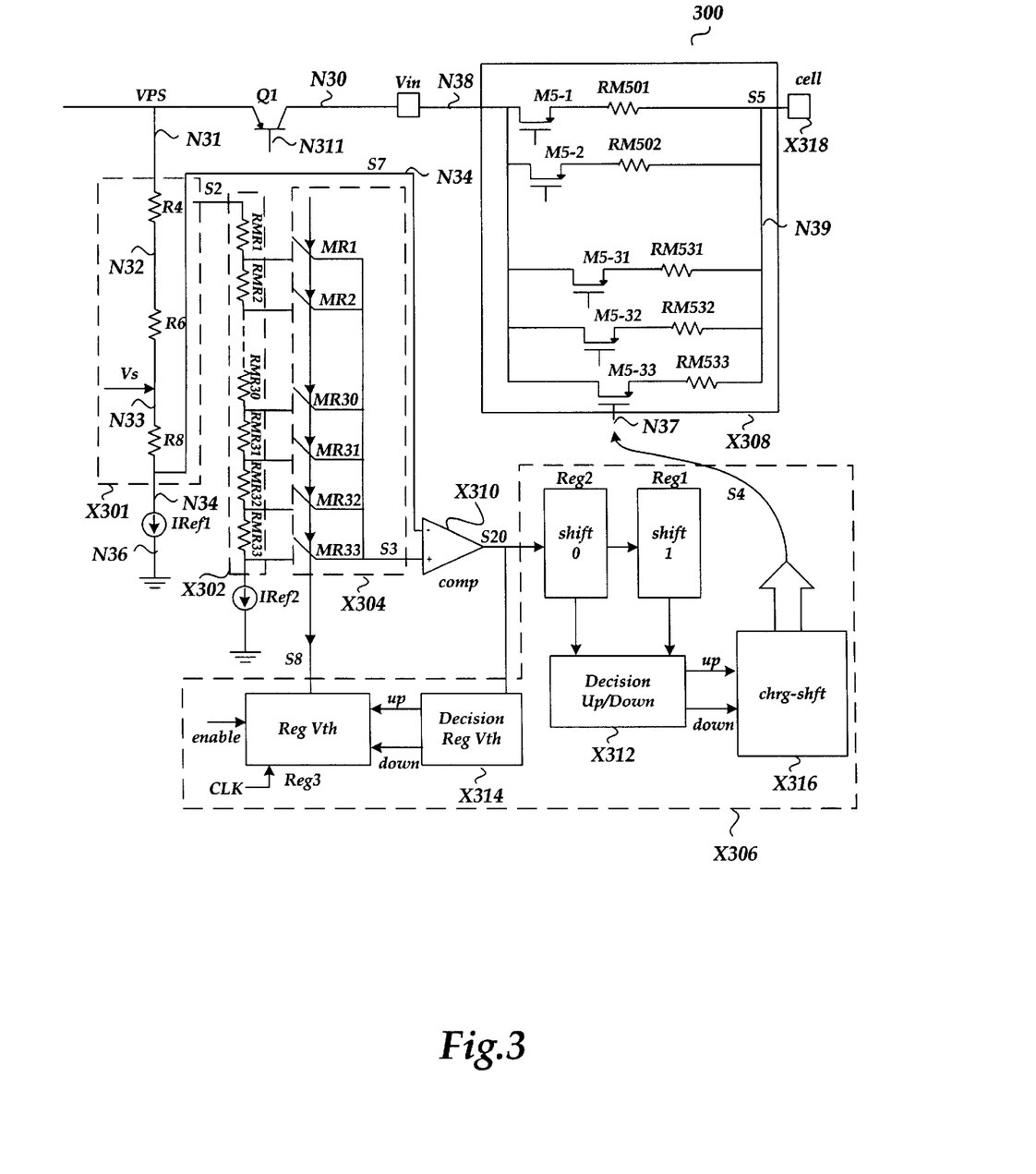
FIG. 3 shows a schematic block diagram of a peak detection circuit.

FIG. 3 is a schematic block diagram of a peak detection circuit implementing the signal processing architecture, in accordance with aspects of the invention. As shown in the figure, peak detection circuit 300 includes transistor Q1, resistor array X301 (resistor R4, resistor R6, and resistor R8), current source IRef1, current source IRef2, resistor array X302, multiplexer X304, decision logic circuit X306, transistor array X308, comparator X310, cell X318, and input VIN. Transistor array X308 includes transistors M5-1 through M5-33 and resistors RM501 through RM533. Multiplexer X304 includes switches MR1 through MR33. Resistor array X302 includes resistors RMR1 through RMR33.

Decision logic circuit X306 includes register Reg1, register Reg2, register Reg3, decision up/down circuit X312, decision circuit X314, and charger shifting circuit X316.

Peak detection circuit 300 is connected as follows. Transistor Q1 has a collector coupled to node N30, an emitter coupled to node N31, and a base coupled to node N311. Input VIN is coupled between node N30 and node N38. Resistor R4 is coupled between node N31 and node N32. Resistor R6 is coupled between node N32 and node N33. Resistor R8 is coupled between node N33 and node N34. Current source IRef1 is coupled between node N34 and node N36. Node N36 is coupled to a reference voltage (gnd). Resistor RMR1 is coupled between node N32 and node NMR1. Switch MR1 is coupled between node NMR1 and node N35, and has a switch control coupled to an input to register reg3. Resistor RMR2 is coupled between node NMR1 and node NMR2. Switch MR2 is coupled between node NMR2 and node N35, and has a switch control coupled to the input to register reg3. Resistor MR3 is coupled between node NRM2 and node NMR3. Switch MR3 is coupled between node NMR3 and node N35, and has a switch control coupled to the input to register reg3. These connections continue until resistor RMR33 is coupled between NMR32 and node NMR33, and switch MR33 is coupled between node NMR33 and node N35, and has a switch control coupled to the input to register reg3. Current source IRef2 is coupled between node NMR33 and a reference voltage (gnd). Comparator X310 has a non-inverting input (+) coupled to node N35, an inverting input (−) coupled to node N34, and an output coupled to node N312. Decision circuit X314 has an input coupled to node N312, an output coupled to register Reg3, and another output coupled to register Reg3. Register Reg2 has an input coupled to node N312, an output coupled to register Reg1, and another output coupled to decision up/down circuit X312. Register Reg1 has an input coupled to register Reg2, and an output coupled to decision up/down circuit X312. Decision up/down circuit X312 has an input coupled to register Reg1, an input coupled to register Reg2, an output coupled to a first input of charger-shifting logic circuit X316, and an output coupled a second input of charge-shifting circuit X316. Charger shifting circuit X316 has two inputs coupled to decision up/down circuit X312, and a logic output coupled transistor array X308. Each of the transistors M5-1 through M5-33 has a gate coupled to charge shifting circuit X316, a source coupled to node N38, and a drain coupled to its respective resistor RM501 through RM533. Each resistor RM501 through RM533 is coupled between the source of its respective transistor M5-1 through M5-33 and node N39. Cell X318 is coupled to node N39.

Peak detection circuit 300 operates as follows. Peak detection circuit 300 is directed at detecting peaks in voltage VPS (See FIGS. 4A and 4B and related discussion). More specifically, peak detection circuit 300 is configured to respond with a fast attack rate and a slow decay rate. In other words, peak detection circuit 300 responds quickly to increases in voltage and slowly to decreases in voltage.

The specific operation of peak detection circuit 300 will now be described. Resistor array X302, current source IRef2, and multiplexer X304 act together as a controlled reference circuit (in this particular case a DAC), producing reference signal S3 in response to incoming signal S2. Resistor array X301 provides a VPS voltage representation (signal S7). Resistor array X302 provides a reference voltage relating to the input signal S2. The switches (MR1–MR33) actuate in response to signal S8. Signal S8 has a corresponding VPS voltage (VS8rep). In response to the switches actuating, the signal S3 at node N35 increases or decreases. According to one embodiment of the invention, current source Iref1 is created by a shunt circuit that sets the voltage at node N33 to a known voltage. Other reference voltages may be implemented and used.

Comparator X310 compares signal S3 to signal S7 producing comparison result signal S20 at node N312. Signal S20 has a voltage corresponding to a logical level of "low" when the voltage of signal S7 is greater than the voltage of signal S3. Correspondingly, signal S20 has a voltage corresponding to a logical level of "high" when the voltage of signal S7 is less than the voltage of signal S3. Decision logic circuit X306 produces signal S8 in response to comparison result signal S20, signal S3, clock signal CLK, and control signal ENABLE. Samples of comparison result signal S20 are stored in registers Reg1 and Reg2. A first result from comparison result signal S20 is stored in register Reg1, and a second result from comparison signal S20 is stored in register Reg2. According to one embodiment of the invention, only one register is used. According to this particular embodiment, the input is sampled directly by the decision logic. Decision logic circuit X314 determines when signal S3 should increase and when it should decrease, and the result is stored in register reg3.

Decision up/down circuit X312 utilizes an attack counter and delay counter to aid in determining when signal S4 should increase, decrease, or remain the same. Using an algorithm based upon the two comparator results stored in Reg1 and Reg2, the logic in decision up/down circuit X312 determines when the decay counter should be increased, decreased, or reset, and determines when the attack counter should be increased, decreased, or reset. Incrementing and decrementing the attack counter and decay counter affects how quickly the peak detector reacts to changes in VPS. Generally, decision logic circuit X312 implements a fast attack and slow decay. Using the fast attack allows the peak detector to quickly react to the peaks of VPS. Using the slow decay allows the peak detector to slowly react to a diminishing VPS (See FIG. 4B for an exemplary graph). Based on the values of the attack counter and decay counter, decision circuit X312 makes a determination as to whether signal S4 should increase, decrease, or remain the same.

Charger shifting circuit X316 includes drivers that produce a signal S4 to control transistor array X308. Transistor array X308 acts as a DAC (digital/analog converter). Charger shifting circuit X316 adjusts signal S4 according to the input that it receives from decision logic circuit X312. Signal S4 is converted into signal S5 by transistor array X308 and is propagates to cell X318.

According to one embodiment of the invention, peak detection circuit 300 is used in a battery charging circuit. The addition of peak detection circuit 300 to the battery charging circuit allows a smoother operation of the battery charger with a low cost and a low die area. The use of the peak detector avoids seeing the temporary VPS variations that could be detected as a "charger not present" signal thereby affecting the charging of cell X318.

Figure 4A:
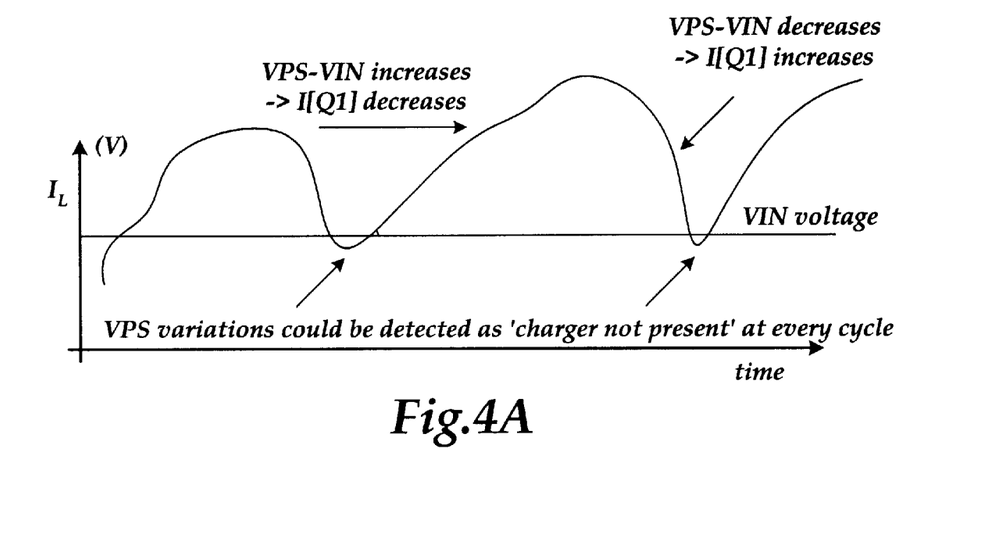
FIG. 4A illustrates an exemplary graph of VPS over time without a peak detector function.

FIG. 4A illustrates an exemplary graph of VPS and VIN over time. As shown in figure, the graph shows voltage VPS periodically dropping below the VIN voltage. Each time VPS drops below VIN, a "charger not present" signal could be detected by the battery charging circuit thereby adversely affecting the charging of the battery.

Figure 4B:
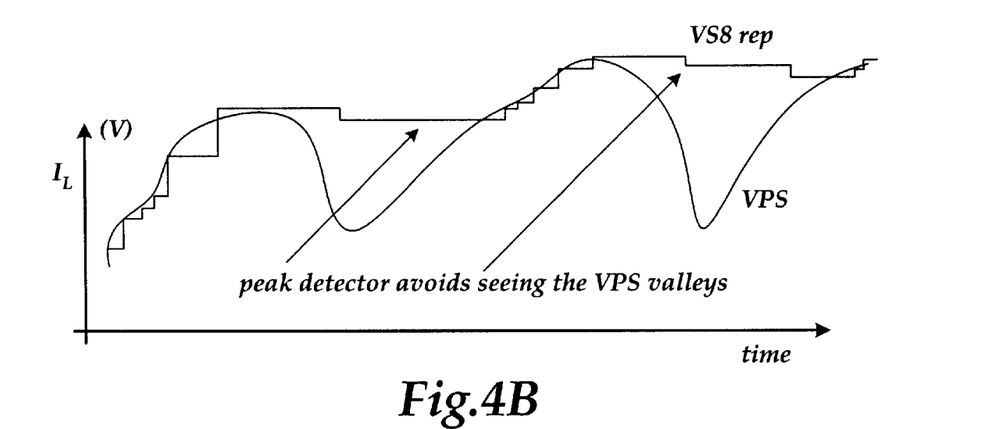
FIG. 4B illustrates an exemplary graph of a peak detector function applied to VPS over time.

FIG. 4B illustrates an exemplary graph of a peak detector signal processing function applied to VPS over time, in accordance with aspects of the invention. As shown in the figure, the graph illustrates voltage VPS and signal VS8rep over time. Signal VS8rep is the corresponding VPS voltage defined for a given S8 code. As can be seen, signal VS8rep does not drop below the VIN voltage thereby avoiding any "charger not present" signals. According to one embodiment of the invention, when VPS increases for two consecutive clock cycles, signal VS8rep increases. The peak detector signal illustrated in FIG. 4 is produced by the peak detector circuit illustrated in FIG. 3. The peak detector has a fast attack and a slow decay. In other words, signal VS8rep increases rapidly in response to increases in voltage VPS and signal VS8rep decreases slowly in response to decreases in voltage VPS. According to one embodiment, signal VS8rep decreases when voltage VPS decreases for 255 consecutive clock cycles. This results in a slow decay, so that signal VS8rep decreases slowly when voltage VPS decreases. The slow decay prevents erratic behavior of the overall circuit. If decay were too fast, valleys in the VPS voltage might be detected as "charger not present," as shown in FIG. 4A. The attack counter and decay counter may be adjusted to change the characteristics of signal VS8rep.

Figure 5:
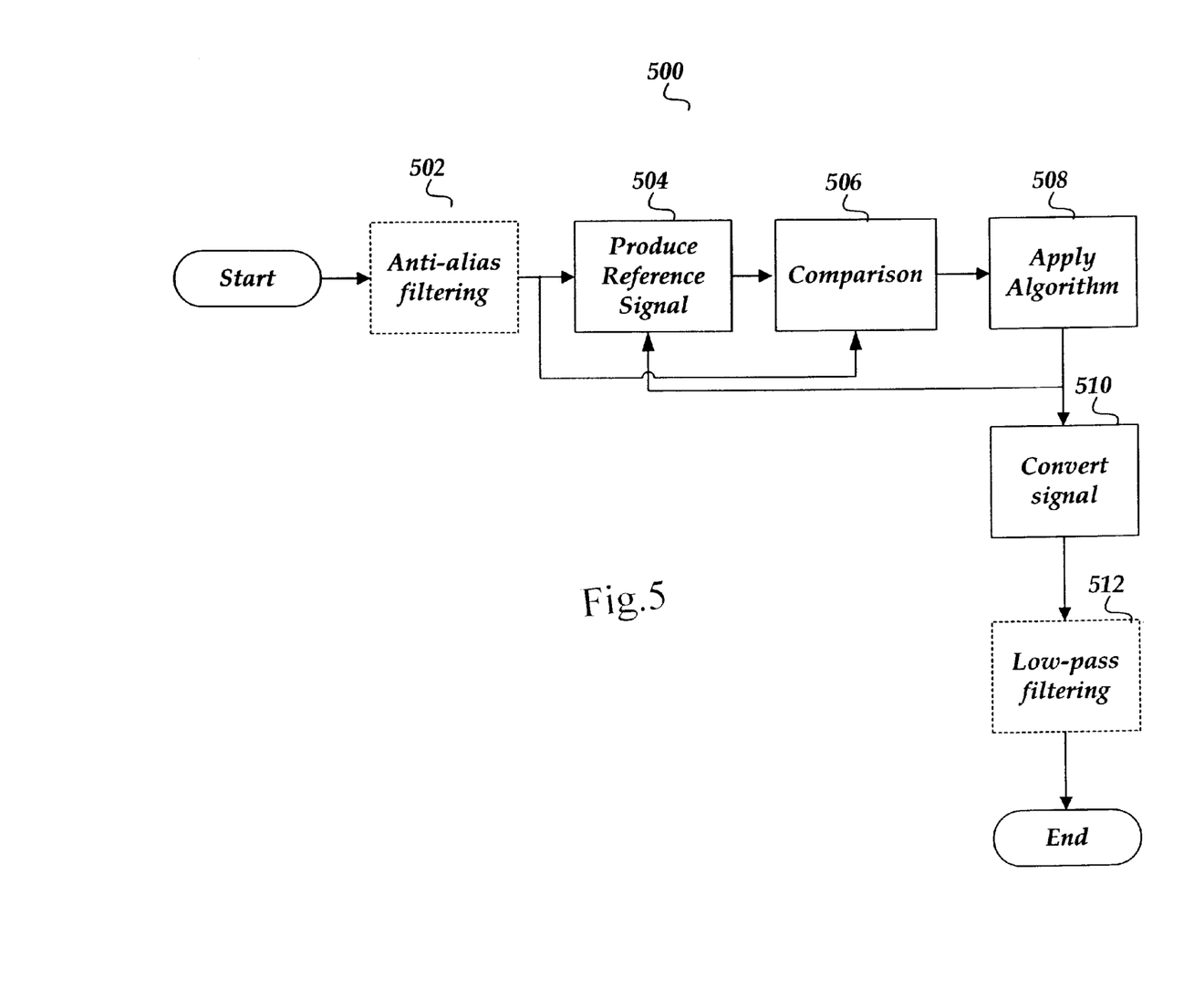
FIG. 5 shows a flow chart for a signal processing architecture.

FIG. 5 shows a flow chart for an exemplary signal processing function, according to one embodiment of the invention. The method for signal processing architecture 500 includes blocks 502, 504, 506, 508, 510, and 512.

The flow for signal processing architecture 500 proceeds as follows. After a start block, the logic moves to block 502. At block 502, a signal is filtered with an anti-alias filter producing a filtered signal. The logic then moves to block 504, at which point the filtered signal is converted into a reference signal. According to one embodiment of the invention, the reference signal relates to a DAC output code. The reference signal itself is adjusted to obtain the desired signal processing function. The reference signal may be adjusted for feedback generated in response to the algorithm implemented at block 508. Stepping to block 506, a comparison is made between the incoming signal and the reference signal. Moving to block 508, a signal processing algorithm is performed based upon the comparison, thereby producing a digital result signal. The signal processing algorithm is determined based on the desired signal processing function to perform on the signal (For one exemplary illustration see FIG. 3 and FIG. 6 and related discussions). Transitioning to block 510, the digital result signal is converted into an analog result signal by a digital/analog conversion technique. The logic then moves to block 512, at which point the analog result signal is filtered with a low pass filter. The logic then steps to an end block and terminates. The digital signal is adjusted until the desired signal processing function is achieved. According to one embodiment, block 502 and block 512 are optional, and can be removed.

Figure 6:
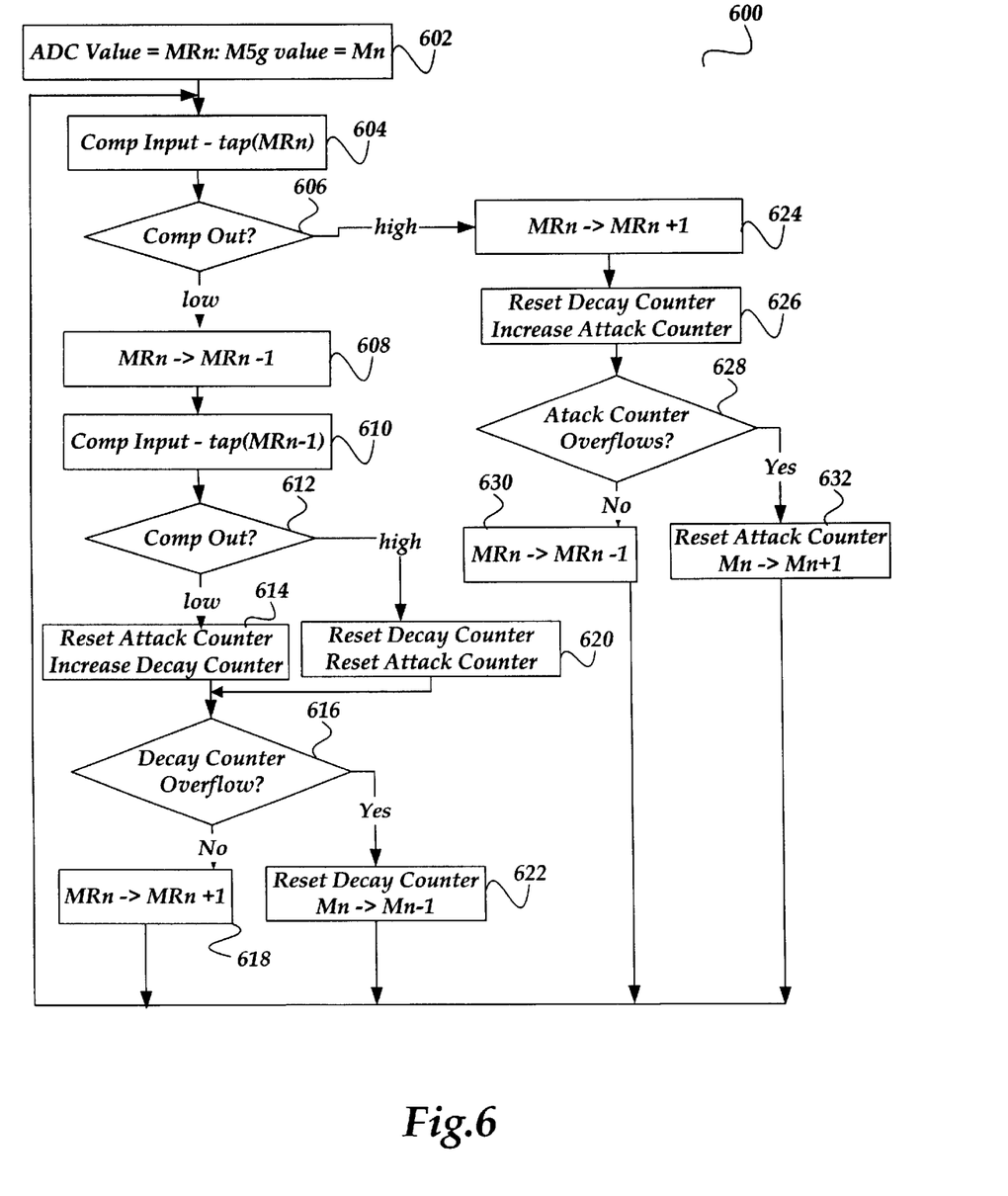
FIG. 6 illustrates a flow chart implementing a method of peak detection, in accordance with aspects of the invention.

FIG. 6 illustrates a flow chart implementing an exemplary method of peak detection, in accordance with aspects of the invention. Other algorithms may be implemented using the signal processing architecture described. For example, single comparison algorithms may be implemented. After a start block, the logical flow moves to block 602. At block 602, the multiplexer node is set by the analog/digital conversion of the analog signal. Transitioning to block 604, the method determines the logical value of the comparison between the reference signal relating to the output code and the input signal itself. Moving to block 606, the method determines whether the logical value of the comparison between the signals is high or low. When the logical value of the comparison between the reference signal and the input signal is low, the logic moves to block 608. At block 608, the process decrements the multiplexer counter. Stepping to block 610, another comparison is made between the signals. At the second comparison, the output code signal has been reduced by one least significant bit. Moving to decision block 612, the process determines whether the second comparison is high or low. When the logical value of the second comparison between the signals is low, the logic moves to block 614. At block 614, the process resets the attack counter and increases the decay counter. Next, at decision block 616, the process determines whether the decay counter has overflowed. When the decay counter has not overflowed the process moves to block 618 at which point the process increments the multiplexer counter. When the decay counter overflows, the logic moves to block 622. At block 622, the process resets the decay counter and decrements the address counter. The logic then returns to block 604.

When the second comparison between the signals is high, the logic moves to block 620. At block 620, the process resets the decay counter and the attack counter. The logical flow then moves to moves to block 618.

When the logical value of the first comparison between the reference signal relating to the output code and the input signal is high, the logic moves to block 624. At block 624, the process increments the multiplexer counter. Moving to block 626, the decay counter is reset and the attack counter is incremented. Transitioning to decision block 628, the method determines whether the attack counter has overflowed. When the attack counter has overflowed, the logic moves to block 632, at which point the attack counter is reset, and the address counter is incremented. When the attack counter has not overflowed, the logic moves to block 630, at which point the multiplexer counter is decremented. The logic then returns to block 604 and repeats itself.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus for implementing a signal processing function, comprising:
   a controlled reference circuit that is configured to produce a reference signal in response to an input signal and a feedback signal;
   a decision level processing circuit coupled to the controlled reference circuit that is configured to compare the reference signal and the input signal, and in response to the comparison, produce the feedback signal that may be used to adjust the reference signal to implement the signal processing function and a decision level processing output signal; and
   a DAC circuit coupled to the decision level processing circuit that is configured to produce an output analog signal in response to the decision level processing output signal.

2. The apparatus as in claim 1, wherein the decision level processing circuit further comprises:
   a comparison circuit that is arranged to produce a comparison result signal in response to the input signal and the reference signal; and
   a decision logic circuit that includes an input coupled to the comparison result signal, an output configured to produce the decision level processing output signal, and another output to produce the feedback signal in response to the comparison result signal, wherein the decision logic circuit is configured to produce the feedback signal that is used to adjust the reference signal in order to produce the signal processing function.

3. The apparatus as in claim 1, further comprising an anti-alias filter circuit, wherein the anti-alias filter circuit is coupled to the input signal and is arranged to filter the input signal to produce a filtered signal that relates to the input signal.

4. The apparatus as in claim 3, further comprising a low pass filter circuit, wherein the low pass filter circuit is arranged to filter the output analog signal.

5. The apparatus as in claim 4, wherein the comparison circuit includes a comparator.

6. The apparatus as in claim 5, wherein the controlled reference circuit is configured as a DAC.

7. The apparatus as in claim 6, wherein the decision logic circuit is arranged to produce the feedback signal according to the algorithm, wherein the algorithm is based upon at least one sample of the comparison result signal.

8. The apparatus of claim 7, wherein the comparator is a sampling comparator.

9. The apparatus as in claim 8, wherein the decision level processing circuit, further comprises a register circuit for storing at least one signal.

10. The apparatus of claim 9, wherein a memory circuit further comprises a first register circuit for storing the comparison result signal.

11. The apparatus of claim 10, wherein the memory circuit further comprises a second register for storing the feedback signal.

12. A method for implementing a signal processing function, comprising:

producing a reference signal;

making a comparison between an input signal and the reference signal;

adjusting the reference signal in response to the comparison to produce the signal processing function, applying an algorithm that relates to the signal processing function; and producing an output signal relating to the signal processing function.

13. The method as in claim 12, wherein adjusting the reference signal in response to the comparison, further comprises adjusting the reference signal in response to a feedback signal, wherein the feedback signal is produced by the algorithm.

14. The method as in claim 13, further comprising applying a low-pass filter to the output signal.

15. An apparatus for signal processing comprising:

a means for producing a reference signal relating to an input signal;

a means for making a comparison between the input signal and the reference signal;

a means for adjusting the reference signal in response to the comparison to implement a signal processing function;

a means for applying an algorithm that relates to the signal processing function; and a means for producing an output signal relating to the adjusting of the reference signal.

* * * * *